(12) United States Patent
Wang et al.

(10) Patent No.: US 11,882,769 B2
(45) Date of Patent: Jan. 23, 2024

(54) MAGNETORESISTIVE RANDOM ACCESS MEMORY STRUCTURE AND METHOD OF MANUFACTURING THE SAME

(71) Applicant: UNITED MICROELECTRONICS CORP., Hsin-Chu (TW)

(72) Inventors: Hui-Lin Wang, Taipei (TW); Bo-Yun Huang, Changhua County (TW); Wen-Wen Zhang, Changhua County (TW); Kun-Chen Ho, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 312 days.

(21) Appl. No.: 17/239,667

(22) Filed: Apr. 25, 2021

(65) Prior Publication Data

US 2022/0302369 A1     Sep. 22, 2022

(30) Foreign Application Priority Data

Mar. 18, 2021   (CN) .......................... 202110291982.4

(51) Int. Cl.
*H01L 43/02*      (2006.01)
*H10N 50/80*      (2023.01)
*H10B 61/00*      (2023.01)
*H10N 50/01*      (2023.01)

(52) U.S. Cl.
CPC ............ *H10N 50/80* (2023.02); *H10B 61/00* (2023.02); *H10N 50/01* (2023.02)

(58) Field of Classification Search
CPC ....... H01L 43/02; H01L 27/22; H01L 27/222; H01L 43/12; H10N 59/00; H10N 50/80; H10N 50/01; H10B 61/00
See application file for complete search history.

(56) References Cited

U.S. PATENT DOCUMENTS

| | | | | |
|---|---|---|---|---|
| 8,866,122 B1* | 10/2014 | Lee | ....................... | H10N 70/826 257/4 |
| 2015/0162529 A1* | 6/2015 | Lee | ....................... | H10N 70/841 711/147 |
| 2016/0172420 A1* | 6/2016 | Bajaj | ..................... | H10B 63/20 257/4 |
| 2020/0411758 A1* | 12/2020 | Lin | ....................... | H10N 70/826 |

FOREIGN PATENT DOCUMENTS

WO        WO-9605332 A2 *  2/1996  ............. C23C 10/60

* cited by examiner

*Primary Examiner* — Cuong B Nguyen
(74) *Attorney, Agent, or Firm* — Winston Hsu

(57) ABSTRACT

A magnetoresistive random access memory (MRAM) structure is provided in the present invention, including multiple MRAM cells, and an atomic layer deposition dielectric layer between and at outer sides of the MRAM cells, wherein the material of top electrode layer is titanium nitride, and the nitrogen percentage is greater than titanium percentage and further greater than oxygen percentage in the titanium nitride, and the nitrogen percentage gradually increases inward from the top surface of top electrode layer to a depth and then start to gradually decrease to a first level and then remains constant, and the titanium percentage gradually decreases inward from the top surface of top electrode layer to the depth and then start to gradually increase to a second level and then remains constant.

14 Claims, 4 Drawing Sheets

MAGNETORESISTIVE RANDOM ACCESS MEMORY STRUCTURE AND METHOD OF MANUFACTURING THE SAME

BACKGROUND OF THE INVENTION

1. Field of the Invention

The present invention relates generally to a magnetoresistive random access memory (MRAM), and more specifically, to a MRAM structure with particular material compositions in its top electrode layer and relevant processes.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate magnetoresistive random access memory (MRAM) devices, which typically has the advantage of keeping stored data even when the device is not connected to an electrical source.

MRAM is a kind of non-volatile memory that has drawn a lot of attention in this technology field recently regarding its potentials of incorporating advantages of other kinds of memories. For example, an MRAM device may have an operation speed comparable to SRAMs, the non-volatile feature and low power consumption comparable to flash, the high integrity and durability comparable to DRAM. More important, the process for forming MRAM devices may be conveniently incorporated into current semiconductor manufacturing processes. Thus, it has the potential to become primary memory used in semiconductor chips.

A typical MRAM cell structure usually comprises a memory stack structure comprising magnetic tunnel junction (MTJ) set between lower and upper interconnecting structures. Unlike conventional memories that data is stored by electric charge or current flow, an MRAM cell stores data by applying external magnetic fields to control the magnetic polarity and tunneling magnetoresistance (TMR) of the magnetic tunnel junction.

SUMMARY OF THE INVENTION

The present invention provides a method of manufacturing a magnetoresistive random access memory (MRAM), featuring the use of etch back process and wet clean process in the process to form the atomic layer deposition dielectric layer surrounding the MRAM cells, and altering the composition of top electrode layer of the MRAM cells.

One aspect of present invention is to provide a magnetoresistive random access memory (MRAM) structure, including multiple MRAM cells, wherein each said MRAM cell includes a bottom electrode layer on a substrate, a magnetic tunnel junction stack on said bottom electrode layer, and a top electrode layer on said magnetic tunnel junction stack, an atomic layer deposition layer at outer sides of said MRAM cells and between said MRAM cells, wherein a material of said top electrode layer is titanium nitride, and a nitrogen percentage is greater than a titanium percentage and further greater than an oxygen percentage in said titanium nitride, and said nitrogen percentage gradually increases inward from a top surface of said top electrode layer to a depth and then start to gradually decrease to a first level and then remains constant, and said titanium percentage gradually decreases inward from said top surface of said top electrode layer to said depth and then start to gradually increase to a second level and then remains constant.

Another aspect of present invention is to provide a method of manufacturing a magnetoresistive random access memory (MRAM), including steps of providing a substrate, forming a bottom electrode layer, a magnetic tunnel junction stack and a top electrode layer sequentially on said substrate, patterning said bottom electrode layer, said magnetic tunnel junction stack and said top electrode layer into multiple MRAM cells, depositing an atomic layer deposition layer on said MRAM cells and said substrate, wherein said atomic layer deposition layer fills up gaps between said MRAM cells, performing an etch back process to said atomic layer deposition layer to remove said atomic layer deposition layer on said top electrode layer and said substrate, so that said atomic layer deposition layer remains only on outer sides of said MRAM cells and between said MRAM cells, and performing a wet clean process to said MRAM cells after said etch back process, wherein a material of said top electrode layer is titanium nitride, and a nitrogen percentage is greater than a titanium percentage and further greater than an oxygen percentage in said titanium nitride, and said nitrogen percentage gradually increases inward from a top surface of said top electrode layer to a depth and then start to gradually decrease to a first level and then remains constant, and said titanium percentage gradually decreases inward from said top surface of said top electrode layer to said depth and then start to gradually increase to a second level and then remains constant.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
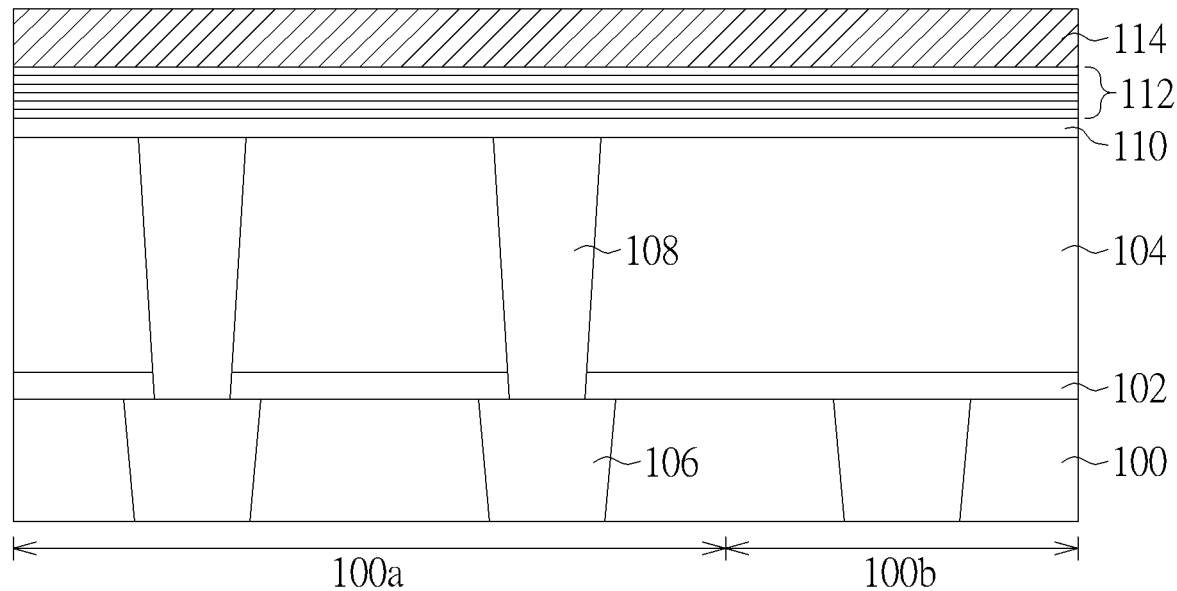
FIGS. 1-7 are cross-sections of a process flow of manufacturing a magnetoresistive random access memory (MRAM) structure in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1 to FIG. 7, which are cross-sections illustrating a process flow of manufacturing a magnetoresistive random access memory (MRAM). As shown in FIG. 1, firstly provide a substrate (not shown), such as a substrate made of semiconductor materials, wherein the semiconductor materials may be selected from silicon (Si), germanium (Ge), silicon-germaniumalloy (SiGe), silicon carbide compound (SiC), silicon arsenide compound (SiAs) or the combination thereof. The substrate is preferably defined with a cell region 100a and a logic region 100b thereon to be used for setting memory arrays and logic circuits (ex. word lines or peripheral circuits). Please note that the key points of present invention focus on the structure of MRAM cells and structure on the cell region 100a and relevant processes.

Refer still to FIG. 1. An inter-metal dielectric (IMD) layer 100, a stop layer 102 and a dielectric layer 104 may be formed sequentially on the substrate through chemical vapor deposition (CVD) or plasma-enhanced chemical vapor deposition (PECVD). In the embodiment of present invention, the inter-metal dielectric layer 100 may be an inter-metal dielectric layer in lower metal interconnect tier (ex. a second metal layer M2), which the material is preferably ultra low-k (ULK) material, such as porous silicon oxycarbide (SiOC). A metal interconnect layer 106, such as the second metal layer M2, may be formed in the inter-metal dielectric layer 100. The material of stop layer 102 is preferably silicon carbonitride (SiCN), nitrogen-doped carbide (NDC) or silicon nitride, etc., to function as an etch stop layer when forming upper contact holes. The material of dielectric layer 104 is preferably but not limited to tetraethoxysilane (TEOS), wherein vias 108 pass through the underlying stop layer 102 to electrically connect with the metal interconnect layer 106 in the cell region 100a. The material of metal interconnect layer 106 and via 108 may be selected from but not limited to tungsten (W), copper (Cu), aluminum (Al), titaniumaluminide (TiAl), cobalt tungsten phosphide (CoWP) or the combination thereof.

Refer still to FIG. 1. A bottom electrode layer 110, a magnetic tunnel junction (MTJ) stack 112 and a top electrode layer 114 are further formed sequentially on the dielectric layer 104. The bottom electrode layer 110, the magnetic tunnel junction stack 112 and the top electrode layer 114 may be in-situ formed by physical vapor deposition (PVD) in the same chamber. In the embodiment of present invention, the material of bottom electrode layer 110 preferably includes conductive materials such as tantalum nitride (TaN), but not limited thereto. According to other embodiment of the present invention, the bottom electrode layer 110 may further include tantalum (Ta), platinum (Pt), copper (Cu), gold (Au), aluminum (Al) or the combination thereof. The magnetic tunnel junction stack 112 is a multilayer structure, which may include structures like seed layer, pinned layer, reference layer, tunneling barrier layer, free layer and metal spacer, etc. Generally, the pinned layer could be made of antiferromagnetic (AFM) material including but not limited to ferromanganese (FeMn), platinum manganese (PtMn), iridium manganese (IrMn), nickel oxide (NiO) or combination thereof, to fix or restrict the direction of magnetic moment of adjacent layers. The tunneling barrier layer could include oxide containing insulating material such as aluminum oxide ($AlO_X$) or magnesium oxide (MgO), but not limited thereto. The free layer could be made of ferromagnetic material including but not limited to iron (Fe), cobalt (Co), nickel (Ni) or the alloys thereof, such as cobalt-iron-boron (CoFeB) alloy, in which the magnetized direction of the free layer could be altered freely depending on the influence of external magnetic field. Since detailed structure of the magnetic tunnel junction stack 112 is not the key point of present invention, all of the aforementioned multilayer structure will be represented by the magnetic tunnel junction stack 112 in the drawings. The material of top electrode layer 114 is titanium nitride (TiN).

Figure 2:
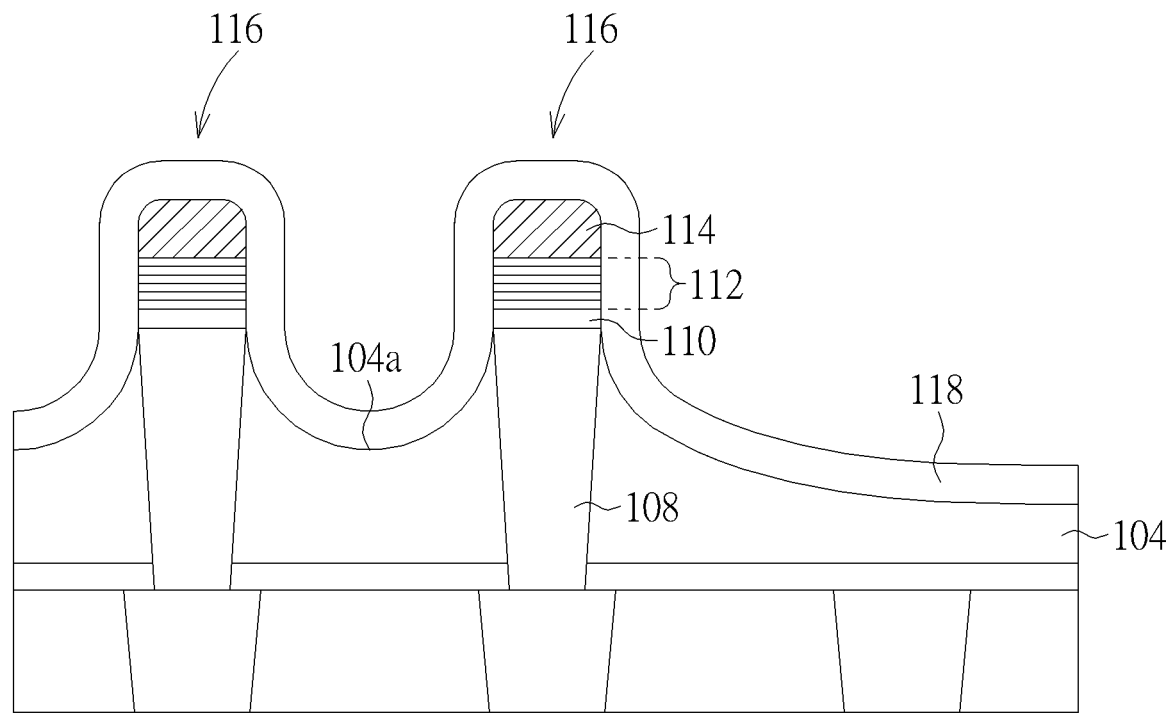

Next, as shown in FIG. 2, the top electrode layer 114, the magnetic tunnel junction stack 112 and the bottom electrode layer 110 are patterned by a photolithography process to define individual MRAM cells 116, wherein a reactive ion etching (RIE) process may be first used with a silicon oxide layer as hard mask to pattern the top electrode layer 114, so that less sidewall byproduct is formed in the process. An ion beam etching (IBE) process is then used to pattern the magnetic tunnel junction stack 112 and the bottom electrode layer 110 to define the MRAM cells 116. Since the characteristics of ion beam etching process, the surface 104a of remaining dielectric layer 104 after etching would be preferably lower than the upper surface of via 108 and is preferably a cambered or curved surface. After the patterning process, a conformal liner 118 is formed on the surface of MRAM cells 116 and the dielectric layer 104, wherein the material of liner 118 preferably includes silicon nitride. However, other dielectric material such as silicon oxide, silicon oxynitride (SiON) or silicon oxide carbide (SiOC) may be selected depending on process requirements. The liner 118 has uniform thickness, covering on the MRAM cells 116 and the dielectric layer 104. Please note that although there are only two MRAM cells 116 presented in the figures of present invention, those generally skilled in the art should understand there may be multiple MRAM cells set in one cell regions or in one memory array.

Figure 3:
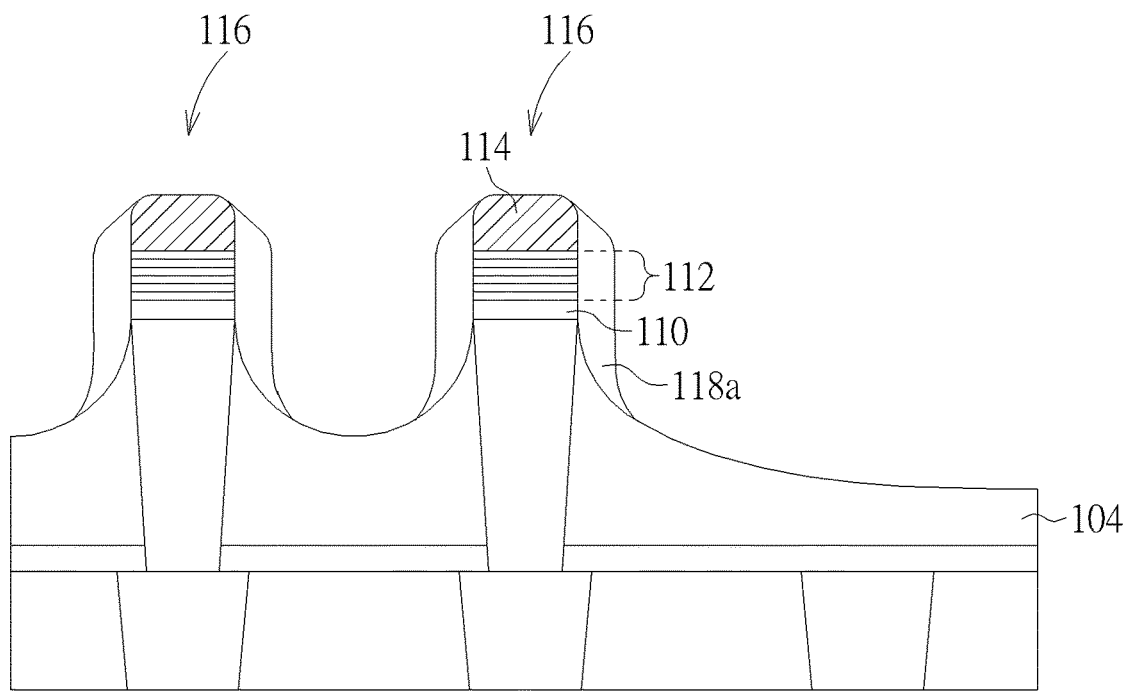

Next, please refer to FIG. 3, an etch back process, such as an anisotropic etching process, is performed to remove parts of the liner 118 in a predetermined thickness, so that only the liner 118 at sidewalls of the MRAM cells 116 remains to form spacer 118a. The spacers 118a would cover the magnetic tunnel junction stack 112 and the bottom electrode layer 110 of MRAM cells 116 to provide protection and isolation effect. The region outside the MRAM cells 116 is not covered by the liners 118 or the spacers 118a. The top electrode layer 110 of MRAM cell 116 would expose from the spacers 118a.

Figure 4:
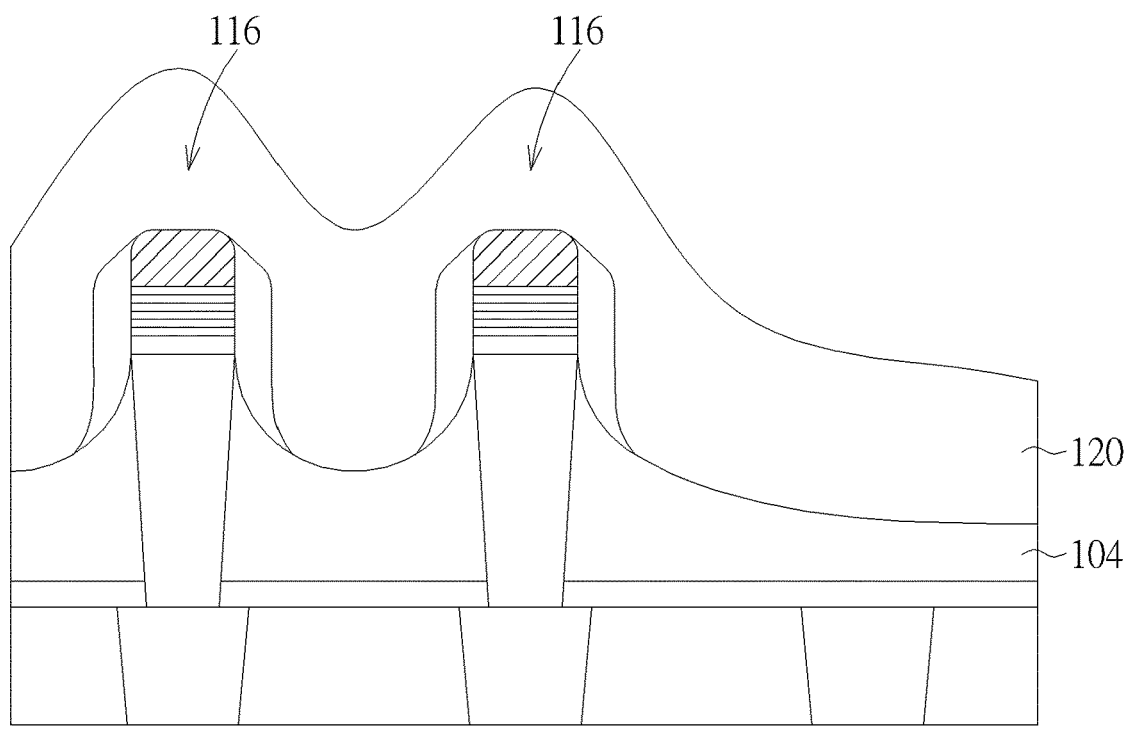

Next, as shown in FIG. 4, an atomic layer deposition (ALD) dielectric layer 120 is blanket deposited on the MRAM cells 116 and the dielectric layer 104 with the material including but not limited to tetraethyl orthosilicate (TEOS), silicon oxide, silicon nitride or the combination thereof. In comparison to the approach of using ultra low-k material directly covering on the MRAM cells 116 in prior art, atomic layer deposition process is used in the present embodiment to form additional dielectric layers and efficiently prevent gaps formed between the MRAM cells 116, thereby achieving better surface coverage. The surface of atomic layer deposition dielectric layer 120 would undulate along with the substrate surface, especially at the positions of MRAM cells 116.

Figure 5:
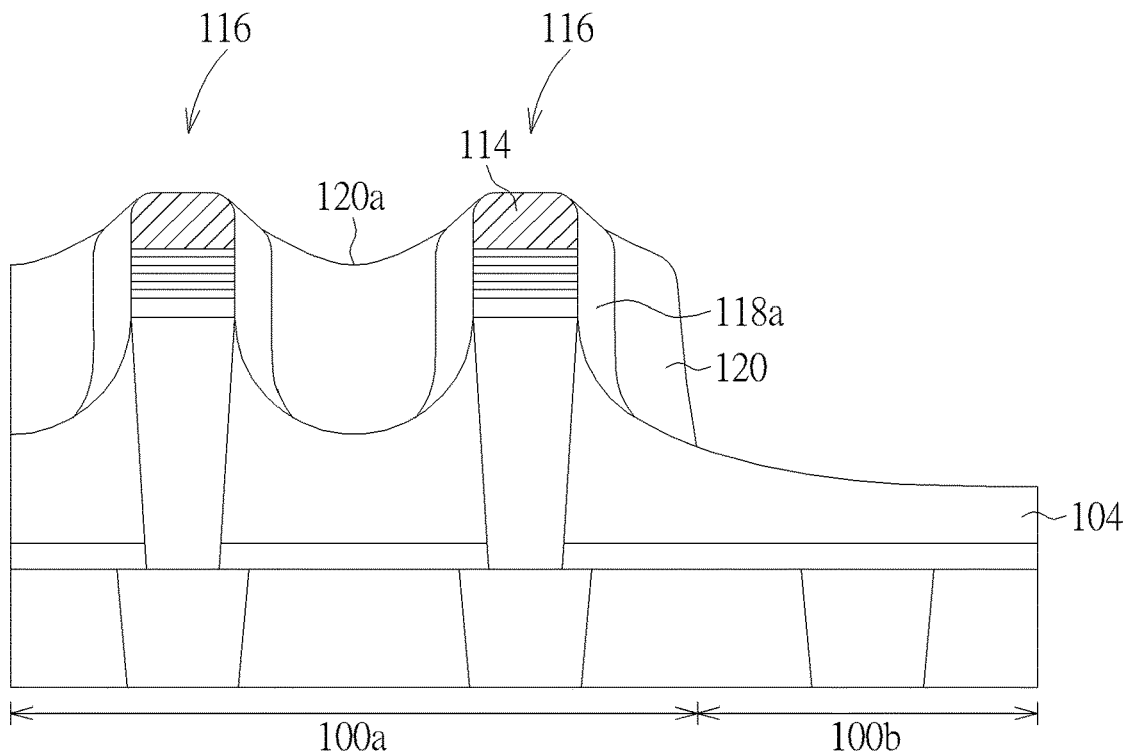

Next, as shown in FIG. 5, an etch back process, such as an anisotropic dry etching process, is performed to remove the atomic layer deposition dielectric layer 120 outside the cell region 100a and the atomic layer deposition dielectric layer 120 on the MRAM cells 116 and the spacers 118a, so that the logic region 110b will not be covered by the atomic layer deposition dielectric layer 120, and the top electrode layers 114 and the spacers 118a of MRAM cells 116 may be exposed from the atomic layer deposition dielectric layer 120. Due to the etch back process, the surface of atomic layer deposition dielectric layer 120 is a curved surface concave downward to the boundaries between the cell region 100a and the logic region 100b, and the atomic layer deposition dielectric layer 120 would still fill up the gaps between the MRAM cells 116 after the etch back process, with concaves 120a formed on the atomic layer deposition dielectric layer 120 between the MRAM cells 116.

In the embodiment of present invention, a wet clean process (for example, using the EKC®580 solvent of DuPont Company) is further performed after the etch back process to remove metal oxides or polymer residues formed on the surface of MRAM cells 116. The alkaline hydrogen peroxide ($H_2O_2$) component in EKC®580 solvent would oxidize parts of exposed titanium nitride based top electrode layers 114 to form titanium oxide product ($TiO^{2+}$), and the titanium oxide product would combine and dissolve in water, as shown by following chemical formulas (1) and (2):

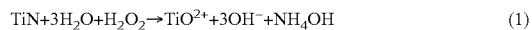

$$TiN + 3H_2O + H_2O_2 \rightarrow TiO^{2+} + 3OH^- + NH_4OH \qquad (1)$$

$$TiO^{2+} + H_2O[OH-] \rightarrow TiO^{2+} \cdot H_2O \qquad (2)$$

On the other hand, the hydrogen peroxide component may react with the polymer (ex. hydrofluorocarbon compound $C_xH_yF_z$) formed in previous etch back process to form water-soluble hydrofluorocarbon oxide ($C_xH_yF_zO_a$) product, and the diluted hydrogen fluoride (HF) component in the solvent may react with the metal oxides (ex. undissolved titanium oxide) remaining on the process surface to form water-soluble metal oxyfluoride, as shown by following chemical formulas (3) and (4):

$$C_xH_yF_z + H_2O_2 \rightarrow C_xH_yF_zO_a \qquad (3)$$

$$MO_x + HF \rightarrow MO_yF_z^- \qquad (4)$$

All of the aforementioned water-soluble reaction products may be removed in the wet clean process to achieve excellent cleaning effectiveness.

Figure 8:
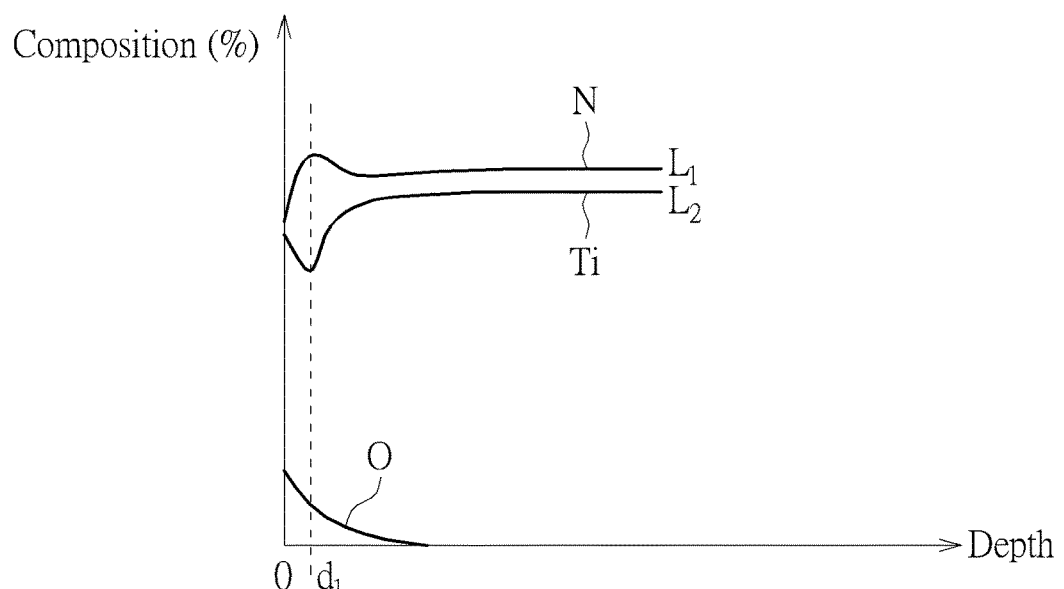
FIG. 8 is a curve chart of the depth versus the composition of a top electrode layers in MRAM cells in accordance with the embodiment of the present invention.

In the present invention, since the etch back process and the wet clean process are used sequentially to remove parts of the atomic layer deposition dielectric layer 120 and to clean the processed surface, the composition of exposed titanium nitride based top electrode layers 114 would be effected and altered by these processes, as shown in FIG. 8. FIG. 8 is a curve chart of the depth versus the composition of top electrode layers 114, wherein the x-axis in the figure is the independent variable representing the depth inward from the surface of top electrode layers 114, and y-axis is the dependent variable representing the compositions of nitrogen (N), titanium (Ti) and oxygen (O) in corresponding depths, wherein a sum of the compositions of nitrogen (N), titanium (Ti) and oxygen (O) in top electrode layers 114 is substantially 100%. It can be seen in the figure that, in the embodiment of present invention, the percentages of nitrogen and titanium are generally the same at the surface of top electrode layers 114, wherein the nitrogen percentage gradually increases inward from the top surface of top electrode layer 114 to a depth d1 and then start to gradually decrease to a first level L1 and remains constant, and the titanium percentage would gradually decrease inward from the top surface of top electrode layer 114 to the depth d1 and then start to gradually increase to a second level L2 and remains constant. The second level L2 is less than the first level L1. In the embodiment of present invention, the top electrode layer 114 further includes a small amount of oxygen component, wherein the oxygen percentage gradually decreases inward to 0% from the top surface of top electrode layer 114. Generally, the nitrogen percentage is greater than the titanium percentage and further greater than the oxygen percentage in the top electrode layer 114.

In the embodiment of present invention, the composition of top electrode layer 114 as shown in the curve chart above is resulted from the aforementioned etch back process and wet clean process. Since the effects of plasma ion bombardment in the etch back process and the chemical reaction of introduced nitrogen gas, the nitrogen percentage in the top electrode layer 114 would gradually increase inward from the surface and reach its peak value at the depth $d_1$. The influence of etch back process diminishes beyond the depth $d_1$, so that the nitrogen percentage would gradually decrease to its inherent first level $L_1$. On the other hand, the titanium percentage in the top electrode layer 114 changes inversely to the nitrogen percentage, that is, gradually decreases inward from the surface and reaches its valley value at the depth $d_1$. The titanium percentage beyond the depth $d_1$ would increase gradually to its inherent second level $L_2$. The oxygen component in the top electrode layer 114 is introduced by the hydrogen peroxide in the wet clean process. Since the process is not applied through ion bombardment, the oxygen percentage would gradually decrease inward to 0% from the top surface of top electrode layer 114.

Figure 6:
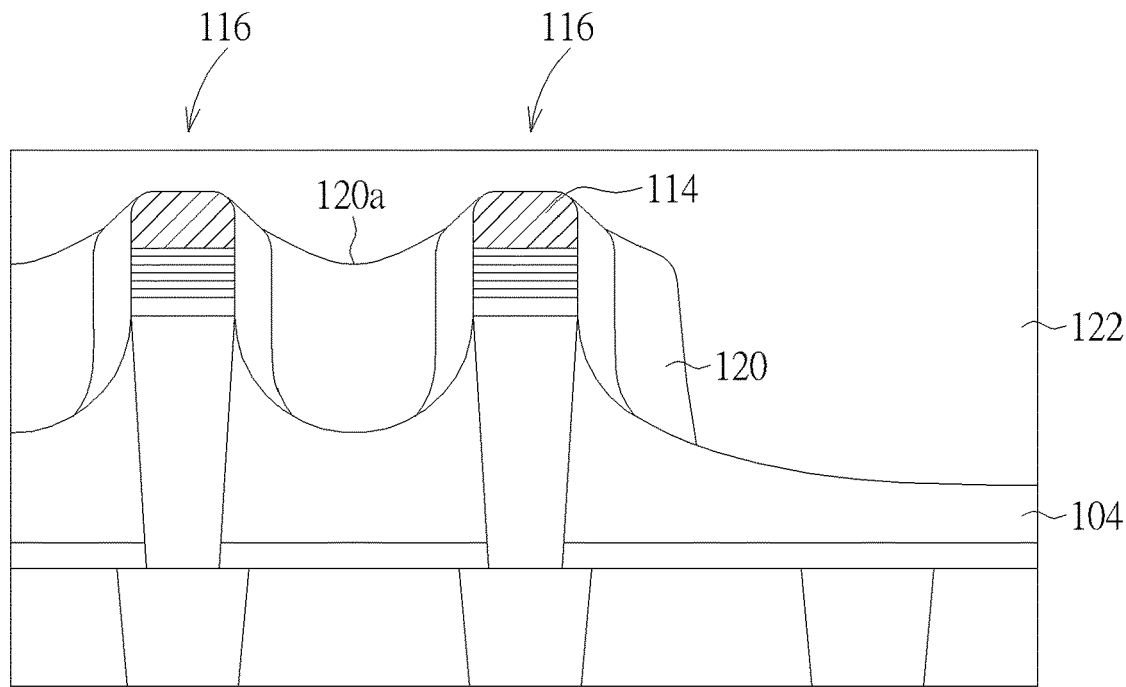

Next, as shown in FIG. 6, another inter-metal dielectric layer 122 is formed on the atomic layer deposition dielectric layer 120 to fill up the regions, for example logic regions, outside the cell region 100a, wherein a planarization process such as chemical mechanical planarization (CMP) is performed to planarize the inter-metal dielectric layer 122, so that its surface would be higher than the surface of top electrode layer 114 in the MRAM cell 116 to provide a flat surface for later processes. The concave 120a of atomic layer deposition dielectric layer 120 between the MRAM cells 116 will also be filled and leveled. In the embodiment of present invention, the material of inter-metal dielectric layer 122 is preferably ultra low-k (ULK) material. Please note that the dielectric constants of atomic layer deposition dielectric layer 120 and inter-metal dielectric layer 122 are different.

Figure 7:
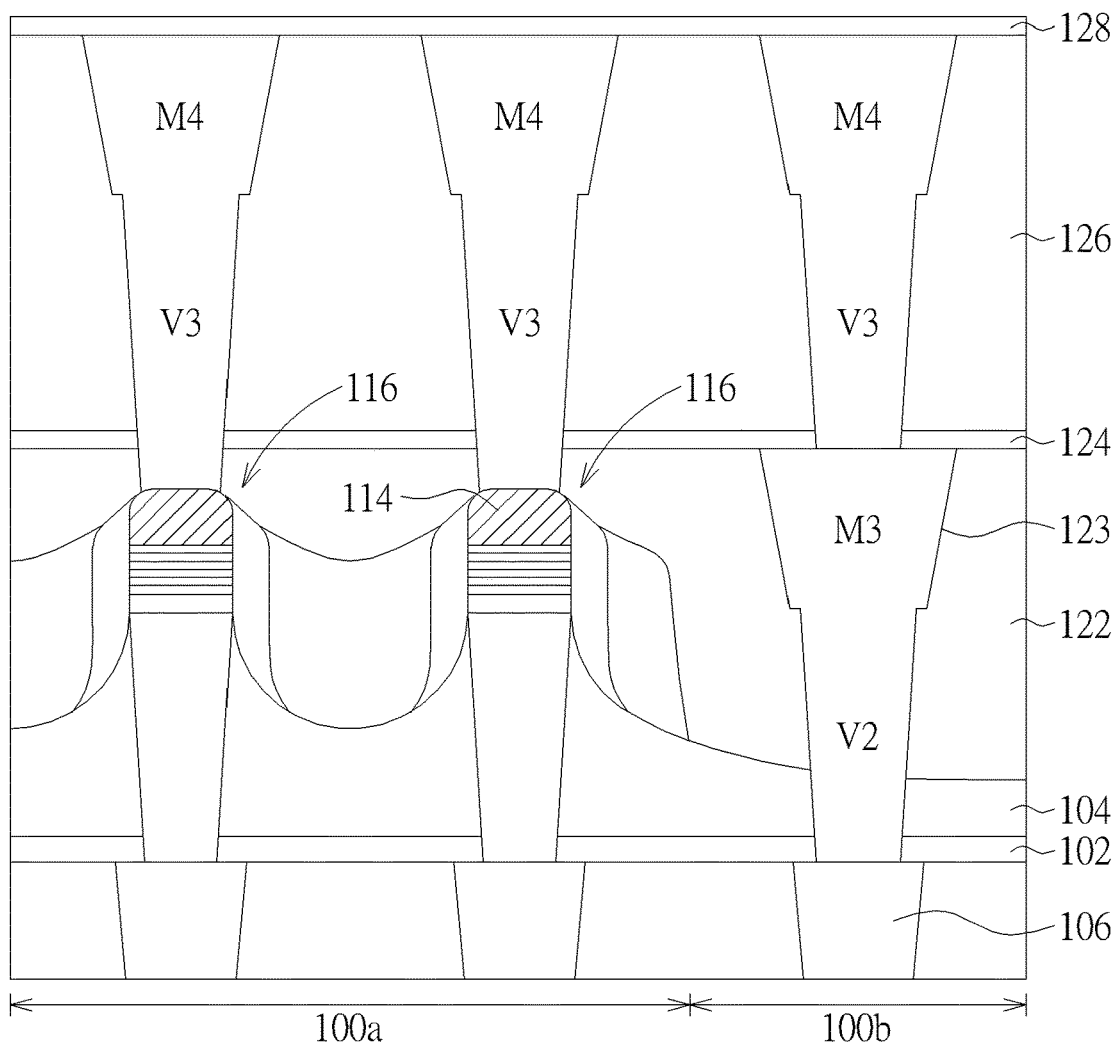

Next, as shown in FIG. 7, a dual damascene recess 123 is form in the shape of a via and a metal interconnect layer in the inter-metal dielectric layer 122. The dual damascene recess 123 may be formed through dual damascene process to interconnect an underlying metal interconnect layer 106, such as the second metal layer M2, in the logic region 100b. The metal material required for filling in the dual damascene recess 123 may include barrier layers with material like titanium (Ti), titanium nitride (TiN), tantalum (Ta) and/or tantalum. nitride (TaN) and low resistance metal layers with material selected from low resistance materials like tungsten (W), copper (Cu), aluminum (Al), titanium aluminum (TiAl) alloy, cobalt-tungsten-phosphorous (CoWP) alloy or the combination thereof. A planarization process, such as a CMP process, is then performed to remove parts of the metal materials to form the dual damascene structure composed of a via V2 and a metal interconnect layer M3, wherein the via V2 electrically connects the underlying metal interconnect layer 106 in the logic region 100b.

Refer still to FIG. 7. After the via V2 and the metal interconnect layer M3 are formed, another stop layer 124 and another inter-metal dielectric layer 126 are formed sequentially on the surfaces of inter-metal dielectric layer 122 and metal interconnect layer M3. The materials of stop layer 124 and stop layer 102 are the same, which may be silicon carbonitride (SiCN), nitrogen-doped carbide (NDC) or silicon nitride, etc. The materials of inter-metal dielectric layer 126 and inter-metal dielectric layer 122 are the same, which may be ultra low-k material. After the stop layer 124 and the inter-metal dielectric layer 126 are formed, the aforementioned dual damascene process is repeated to form vias V3 and metal interconnect layers M4 in upper tiers, wherein the via V3 above the cell region 100a is electrically connected with the top electrode layer 114 of MRAM cells, while the via V3 above the logic region 100b is electrically connected with the metal interconnect layer M3 in lower tiers. Another stop layer 128 may be further formed on the surface of inter-metal dielectric layer 126 after forming the vias V3 and the metal interconnect layers M4, and the aforementioned steps of manufacturing vias and metal interconnect layers may be repeated again.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetoresistive random access memory (MRAM) structure, comprising:
    multiple MRAM cells, wherein each said MRAM cell comprises:
    a bottom electrode layer on a substrate;
    a magnetic tunnel junction stack on said bottom electrode layer; and
    a top electrode layer on said magnetic tunnel junction stack;
    an atomic deposition layer at outer sides of said MRAM cells and between said MRAM cells;
    wherein a material of said top electrode layer is titanium nitride, and a nitrogen percentage is greater than a titanium percentage and further greater than an oxygen percentage in said titanium nitride, and said nitrogen percentage gradually increases inward from a top surface of said top electrode layer to a depth and then start to gradually decrease to a first level and then remains constant, and said titanium percentage gradually decreases inward from said top surface of said top electrode layer to said depth and then start to gradually increase to a second level and then remains constant.

2. The MRAM structure of claim 1, wherein said oxygen percentage gradually decreases inward to 0% from said top surface of said top electrode layer.

3. The MRAM structure of claim 1, wherein said nitrogen percentage in said titanium nitride is 0% to 50%.

4. The MRAM structure of claim 1, wherein said magnetic tunnel junction stack comprises a seed layer, a pinned layer, a reference layer, a tunnel barrier layer, a free layer and a metal spacer.

5. The MRAM structure of claim 1, further comprising spacers between said MRAM cells and said atomic deposition layer.

6. The MRAM structure of claim 1, further comprising an inter-metal dielectric layer covering said MRAM cells and said atomic deposition layer.

7. The MRAM structure of claim 1, wherein said bottom electrode layer and said top electrode layer are connected respectively with lower and upper metal interconnect layers through vias.

8. A method of manufacturing a magnetoresistive random access memory (MRAM), comprising:
    providing a substrate;
    forming a bottom electrode layer, a magnetic tunnel junction stack and a top electrode layer sequentially on said substrate;
    patterning said bottom electrode layer, said magnetic tunnel junction stack and said top electrode layer into multiple MRAM cells;
    depositing an atomic deposition layer on said MRAM cells and said substrate, wherein said atomic deposition layer fills up gaps between said MRAM cells;
    performing an etch back process to said atomic deposition layer to remove said atomic deposition layer on said top electrode layer and said substrate, so that said atomic deposition layer remains only on outer sides of said MRAM cells and between said MRAM cells; and
    performing a wet clean process to said MRAM cells after said etch back process;
    wherein a material of said top electrode layer is titanium nitride, and a nitrogen percentage is greater than a titanium percentage and further greater than an oxygen percentage in said titanium nitride, and said nitrogen percentage gradually increases inward from a top surface of said top electrode layer to a depth and then start to gradually decrease to a first level and then remains constant, and said titanium percentage gradually decreases inward from said top surface of said top electrode layer to said depth and then start to gradually increase to a second level and then remains constant.

9. A method of manufacturing a MRAM of claim 8, wherein said etch back process and said wet clean process make said oxygen percentage in said top electrode layer gradually decreasing inward to 0% from said top surface of said top electrode layer.

10. A method of manufacturing a MRAM of claim 8, wherein said wet clean process uses EKC®580 solvent.

11. A method of manufacturing a MRAM of claim 8, wherein said nitrogen percentage in said titanium nitride is 0% to 50%.

12. A method of manufacturing a MRAM of claim 8, wherein said magnetic tunnel junction stack comprises a seed layer, a pinned layer, a reference layer, a tunnel barrier layer, a free layer and a metal spacer.

13. A method of manufacturing a MRAM of claim 8, further comprising:
- forming a liner on said MRAM cells and said substrate before forming said atomic deposition layer; and
- performing another etch back process to remove parts of said liner, so that said liner remains only on outer sides of said MRAM cells, thereby forming spacers between said MRAM cells and said atomic deposition layer.

14. A method of manufacturing a MRAM of claim 8, further comprising forming an inter-metal dielectric layer on said MRAM cells and said atomic deposition layer.

\* \* \* \* \*